US008458638B2

(12) United States Patent
Menut et al.

(10) Patent No.: US 8,458,638 B2
(45) Date of Patent: Jun. 4, 2013

(54) CELL LIBRARY, INTEGRATED CIRCUIT, AND METHODS OF MAKING SAME

(75) Inventors: Olivier Menut, Saint Martin d'Hères (FR); Laurent Bergher, Meylan (FR); Emek Yesilada, Grenoble (FR); Yorick Trouiller, Grenoble (FR); Franck Foussadier, Grenoble (FR); Raphaël Bingert, Crolles (FR)

(73) Assignees: STMicroelectronics SA, Montrouge (FR); STMicroelectronics (Crolles 2) SAS, Crolles (FR); Commissariat a l'Energie Atomique et aux Energies Alternatives, Paris (FR)

( * ) Notice: Subject to any disclaimer, the term of this patent is extended or adjusted under 35 U.S.C. 154(b) by 92 days.

(21) Appl. No.: 13/023,172

(22) Filed: Feb. 8, 2011

(65) Prior Publication Data

US 2011/0298010 A1 Dec. 8, 2011

(51) Int. Cl.
*G06F 17/50* (2006.01)
(52) U.S. Cl.
USPC ..................... 716/122; 716/119; 716/132
(58) Field of Classification Search
None
See application file for complete search history.

(56) References Cited

U.S. PATENT DOCUMENTS

| 4,639,753 | A  | * | 1/1987  | Yamada | 257/258 |
| 6,630,699 | B1 | * | 10/2003 | Wylie  | 257/288 |
| 7,441,211 | B1 |   | 10/2008 | Gupta et al. | |
| 2004/0041228 | A1 |   | 3/2004 | Houston | |
| 2004/0238897 | A1 | * | 12/2004 | Oishi | 257/369 |
| 2005/0278660 | A1 |   | 12/2005 | Zhang et al. | |

FOREIGN PATENT DOCUMENTS

| EP | 1 862 926 A2 | 12/2007 |
| JP | 362183555 A | * 8/1987 |

OTHER PUBLICATIONS

Miyatsuji et al., "A Technique for Improving the Distortion of GaAS Variable Attenuator IC Using Squeezed-Gate FET Structure," IEEE 1996 Microwave and Millimeter-Wave Monolithic Circuits Symposium, pp. 43-46.*

Institut National De La Propriete Industrielle, Rapport de Recherche Preliminaire (Preliminary Search Report), issued in French Patent Application No. 10/50891 on Sep. 8, 2010 (2 pages).

Sirisantana et al., "Low-Power Design Using Multiple Channel Lengths and Oxide Thickness," IEEE Design & Test of Computers, Jan.-Feb. 2004 (pp. 56-63).

* cited by examiner

*Primary Examiner* — Leigh Garbowski
(74) *Attorney, Agent, or Firm* — Slater & Matsil, LLP

(57) ABSTRACT

A cell library intended to be used to form an integrated circuit, this library defining a first cell including a first MOS transistor of minimum dimensions, and a second cell including a second MOS transistor of lower leakage current, wherein the second cell takes up the same surface area as the first cell, and the second MOS transistor has a gate of same length as the gate of the first MOS transistor across at least a first width in its central portion, and of greater length across at least a second width on either side of the central portion.

20 Claims, 4 Drawing Sheets

CELL LIBRARY, INTEGRATED CIRCUIT, AND METHODS OF MAKING SAME

This application claims the priority benefit of French Patent Application No. 10/50891, filed on Feb. 9, 2010, and entitled "Cell Library," which is hereby incorporated by reference.

TECHNICAL FIELD

The present invention relates to a standard cell library in MOS technology.

BACKGROUND

Standard cell libraries are used to ease the design and the synthesis of integrated circuits. Each cell corresponds to an elementary component (for example, a MOS transistor) or to an assembly of components performing a function (for example, an OR, AND, NOR, or NAND gate, an inverter, a pair of transistors, an elementary amplifier, etc.). A library contains a set of parameters defining the circuit design and the topology, as well as the input and output terminals of each cell. Each cell is further defined by parameters such as a response time, an output power, etc. In the synthesis of an integrated circuit, cells of the library are selected, arranged, and interconnected, to provide the required circuit functions.

FIG. 1A is a top view very schematically showing an elementary cell 1 containing a single MOS transistor.

FIG. 1B is a cross-section view along plane B-B of cell 1 of FIG. 1A.

The MOS transistor of cell 1, formed in the upper portion of a P-type semiconductor substrate, comprises an N+-type source region 3, and an N+-type drain region 5, located on either side of a gate 7 isolated from the substrate by an insulating layer 9. N-type regions 11 and 13, more lightly doped than regions 3 and 5, are formed in the upper portion of the substrate under insulating spacers 15 and 16. Gate 7 has a length L and a width W. Gate 7 is for example made of polysilicon and has, in top view, the shape of a rectangular strip. Source and drain regions 3 and 5 are generally covered with a silicide contacting layer. The entire cell is delimited by insulating trenches 19 filled with an insulator, for example, silicon oxide, currently designated as STI, for "Shallow Trench Isolation". Vias 21 and 23 come into contact with silicide regions 17 at the level of contact areas 22 and 24, and enable forming electric connections with source and drain regions 3 and 5. Contact areas 22 and 24 are arranged, in top view, substantially at the center of the source and drain regions.

In the case where the MOS transistor of cell 1 must be a transistor of minimum dimensions in the considered technology, the library especially defines that:

the gate length Lmin of the transistor is the minimum gate length that can be achieved in the considered technology, for example, on the order of 40 nm; and distances dGSmin between gate 7 and source contact area 22 and dGDmin between gate 7 and drain contact area 24 are the smallest distances that can be achieved in the considered technology without any risk of short-circuit between the gates and the contact areas, for example, also on the order of 40 nm.

This enables one to obtain a maximum operating speed of the transistor and a minimum silicon surface area consumption.

FIG. 1C is a top view schematically showing another standard cell 31 of the library. Cell 31 comprises two MOS transistors sharing their source-drain. Contact areas 32 and 34 are provided on the side of the non-common drain and source regions of the cell. Cell 31 comprises two parallel gates 37 and 39, of same length Lmin and of same width W. Gates 37 and 39 are arranged between contact areas 32 and 34. The entire cell is delimited by isolation trenches 40. As in cell 1 of FIGS. 1A and 1B, the transistors of cell 31 are made at the minimum dimensions of the selected manufacturing technology. In this case, in addition to the minimum distance between the contact areas and the gates, a minimum distance dGGmin must be respected between the two gates to avoid any risk of short-circuit. Distance dGGmin is for example on the order of 140 nm in 40-nm CMOS technology (the drawing is not to scale).

A disadvantage of MOS transistors of minimum dimensions, and thus of maximum operating speed, is that such transistors have relatively high leakage currents. Indeed, the shorter the gate length of a MOS transistor, the larger the leakage current that it conducts in the off state. This results in an increase of the integrated circuit consumption. For certain transistors of an integrated circuit, the operating speed is not a critical parameter. It is thus unnecessary for such transistors to use cells resulting in high leakage currents.

An obvious solution is to define, in the library, additional cells in which the MOS transistors have a gate length greater than the minimum gate length of the technology. Thus, to form a same component, the designer may, during the synthesis, choose between two cells according to whether he wishes to optimize the transistor operating speed or the electric consumption.

However, increasing the gate length of the transistors implies increasing the surface area taken up by the cell, especially to respect the minimum guard distance between the gate(s) and the source and drain contact areas. Thus, for a same component, the library would define two cells of different sizes, the smaller one being characterized by a higher operating speed of the transistors, and the larger one by a lower electric consumption. In addition to the cost in silicon surface area directly resulting from the increase of the dimensions of certain cells, such a solution has the disadvantage of making the integrated circuit synthesis process more difficult. Indeed, the increase of the number of cells of different sizes in the library causes location and interconnection issues. This especially results in losses in useful silicon surface area.

DETAILED DESCRIPTION OF ILLUSTRATIVE EMBODIMENTS

Figure 1A:
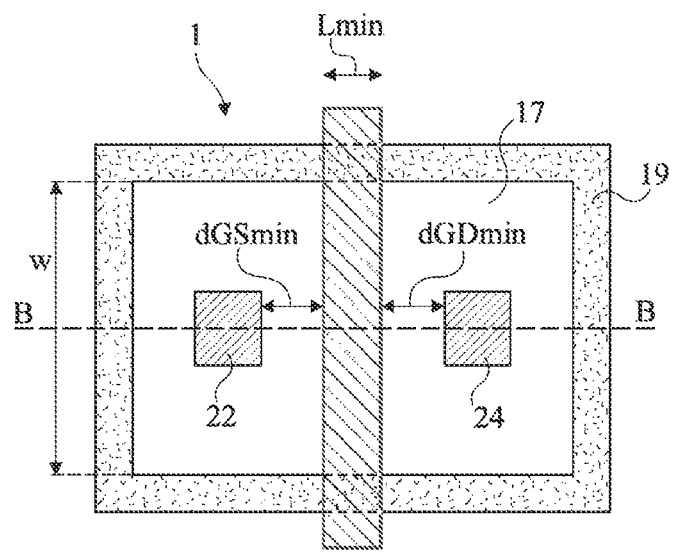
FIG. 1A, previously described, is a top view schematically showing a standard cell of a library, containing a single MOS transistor.

Thus, an object of an embodiment of the present invention is to provide a standard cell library in MOS technology, at least partly overcoming some of the disadvantages of prior art libraries.

An object of an embodiment of the present invention is to provide such a library comprising, for a given component, a cell definition optimizing the operating speed of the transistors, and a cell definition optimizing the electric consumption, the two cells taking up an identical surface area.

An object of an embodiment of the present invention is to provide such a library which is easy to define.

Thus, an embodiment of the present invention provides a cell library intended to be used to form an integrated circuit, this library defining a first cell comprising a first MOS transistor of minimum dimensions, and a second cell comprising a second MOS transistor of lower leakage current, wherein the second cell takes up the same surface area as the first cell, and the second MOS transistor has a gate of same length as the gate of the first MOS transistor across at least a first width in its central portion, and of greater length across at least a second width on either side of the central portion.

According to an embodiment of the present invention, each of the first and second cells comprises two transistors having the same source-drain with parallel gates, and the gates of the transistors of the second cell are of same length as the gates of the transistors of the first cell across said at least a first width, and extending, across said at least a second width, along a greater length towards the side opposite to the common side.

According to an embodiment of the present invention, the first and second cells each comprise, on either side of the gate(s), source/drain contact areas arranged at the center.

Another embodiment of the present invention provides an integrated circuit comprising first and second cells of the above-mentioned library.

Another embodiment of the present invention provides a method for synthesizing at least a portion of an integrated circuit based the above-mentioned cell library, the method comprising, for each MOS transistor of the integrated circuit, the steps of: selecting the first cell if the MOS transistor is intended to operate at maximum speed; and selecting the second cell if the MOS transistor is not intended to operate at maximum speed.

The foregoing objects, features, and advantages of the present invention will be discussed in detail in the following non-limiting description of specific embodiments in connection with the accompanying drawings.

For clarity, the same elements have been designated with the same reference numerals in the different drawings and, further, as usual in the representation of integrated circuits, the various drawings are not to scale.

Figure 1B:
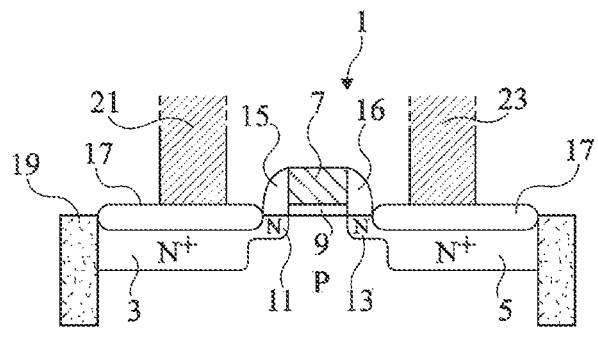
FIG. 1B, previously described, is a cross-section view of FIG. 1A.
Figure 2A:
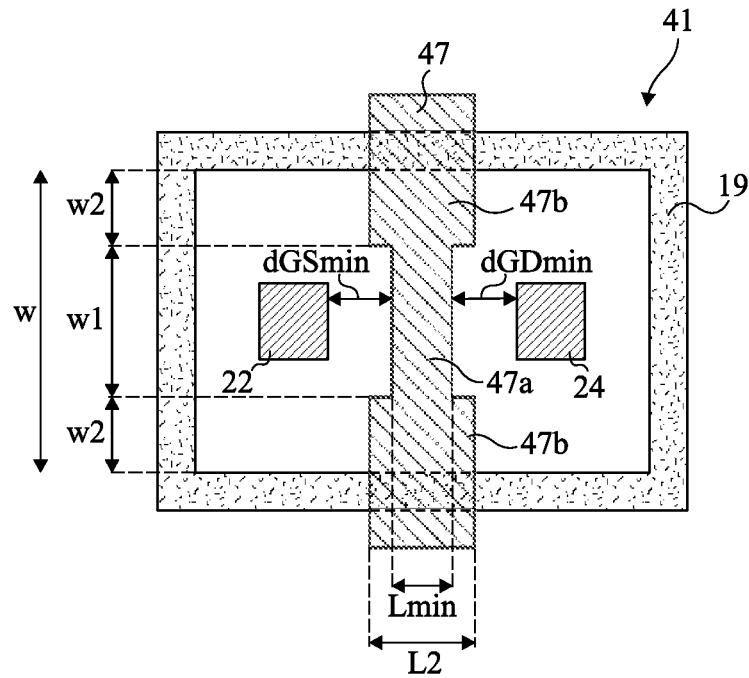
FIG. 2A is a top view schematically showing a cell containing a MOS transistor of decreased leakage current.

FIG. 2A is a top view schematically showing an example of a cell 41 containing a single MOS transistor. Cell 41 is very similar to cell 1 of FIGS. 1A and 1B. Only those elements which are useful to the understanding of the present invention will be described again herein. In the same way as in cell 1, vias reaching contact areas 22 and 24 enable forming electric connections with the source and drain regions of the transistor of cell 41. Contact areas 22 and 24 are arranged, in top view, substantially at the center of the source and drain regions. A gate 47, of same width W as the gate of the MOS transistor of cell 1, for example, on the order of 800 nm, is arranged above the substrate, between contact areas 22 and 24. Cell 41 is delimited by silicon oxide insulating trenches 19.

The surface area taken up by cell 41 is identical to the surface area taken up by cell 1.

On a central gate portion 47a, of width W1 smaller than total width W, at the level of contact areas 22 and 24, the gate length is equal to minimum gate length Lmin of the technology, for example, on the order of 40 nm in 40-nm CMOS technology. Distances dGSmin and dGDmin between gate portion 47a and contact areas 22 and 24 are the minimum distances that may be achieved without risking any short-circuit, for example, on the order of 40 nm in 40-nm CMOS technology.

At each end of gate 47, on portions 47b of width W2 such that W2+W1+W2=W, the gate has a length L2 greater than Lmin. L2 for example ranges between 44 and 60 nm in the context of a 40-nm CMOS technology, the lengthening of the gate with respect to Lmin being equally distributed on each side of the gate. Portions 47b are sufficiently remote from contact areas 22 and 24 for the increase of the gate length to leave a sufficient guard distance between all points of the gate and the contact areas.

Thus, cell 41 is equivalent to a MOS transistor of same gate length as the MOS transistor of cell 1, and takes up a silicon surface area identical to that taken up by cell 1. This transistor has an average gate length greater than the gate length of the transistor of cell 1, which decreases its leakage current.

It should be noted that it is easy, based on the definition of cell 1, to create a definition of cell 41, since it is sufficient to lengthen the gate portions sufficiently remote from the contact areas. Existing cell modeling programs are generally capable of making it easy to perform this modification.

Figure 1C:
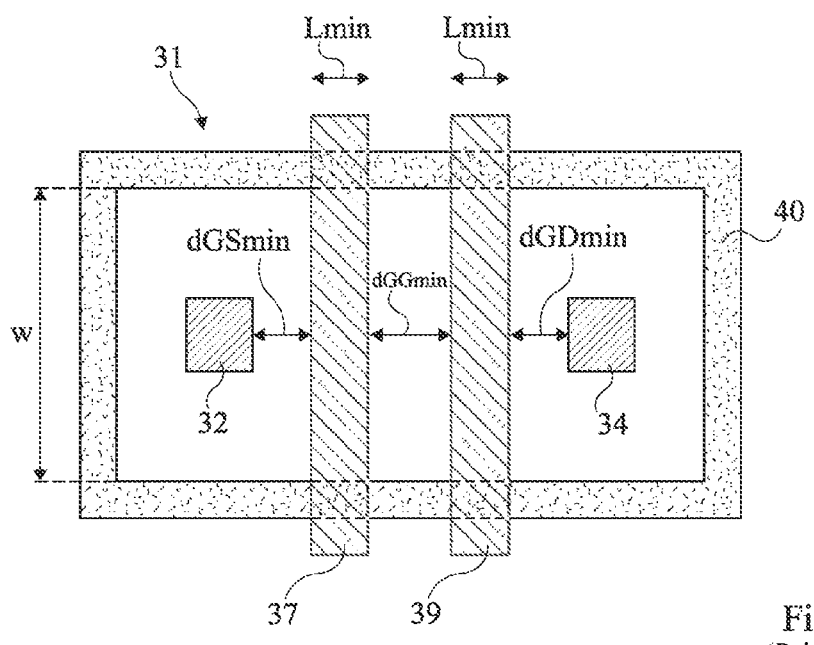
FIG. 1C, previously described, is a top view schematically showing a standard cell of a library, containing a pair of MOS transistors.
Figure 2B:
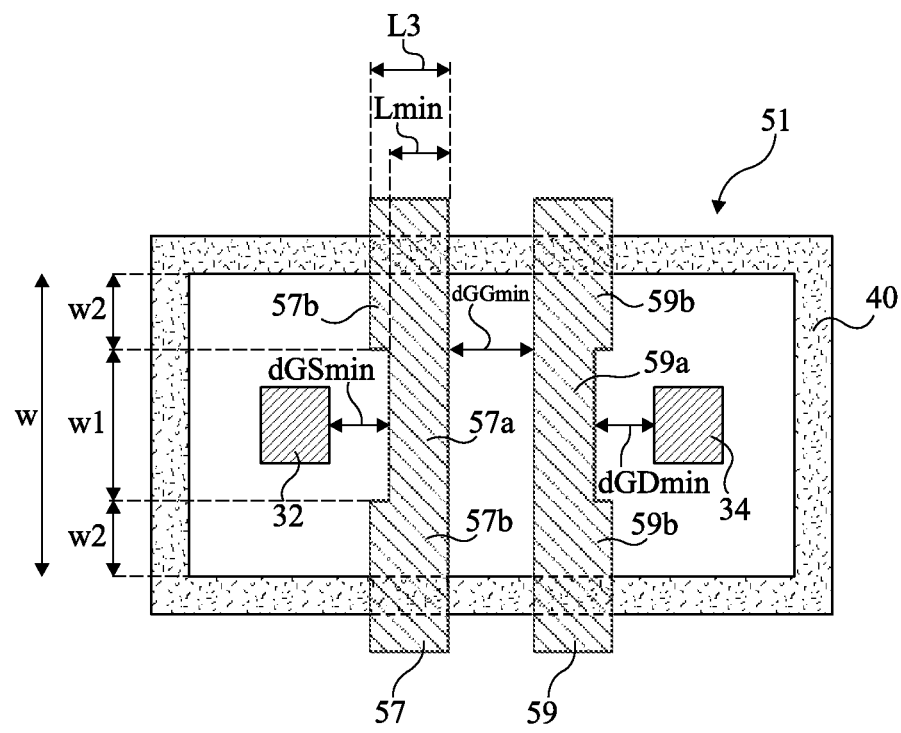
FIG. 2B is a top view schematically showing a cell containing a pair of MOS transistors of decreased leakage current.

FIG. 2B is a top view schematically showing another example of cell 51, containing a pair of MOS transistors. Cell 51 has many similarities with cell 31 of FIG. 1C, and some elements thereof will not be described again herein.

Cell 51 comprises a pair of MOS transistors having the same drain-source. Vias reaching contact areas 32 and 34 enable forming electric connections with the non-common drain and source regions of the cell. Contact areas 32 and 34 are arranged, in top view, substantially at the center of the non-common source and drain regions. Cell 51 comprises two parallel gates 57 and 59 of same width W as the gates of cell 31, for example on the order of 800 nm. Gates 57 and 59 are arranged between contact areas 32 and 34. The cell is delimited by silicon oxide insulating trenches 40.

The surface area taken up by cell 51 is identical to the surface area taken up by cell 31. On central portions 57a and 59a of the gate, of a width W1 smaller than total width W, substantially at the level of contact areas 32 and 34, the gate length is equal to minimum gate length Lmin of the technology, for example, on the order of 40 nm in 40-nm CMOS technology.

On the side of the ends of gates 57 and 59, on portions 57b and 59b of width W2 such that W2+W1+W2=W, the gates have a length L3 greater than Lmin. Length L3 for example ranges between 42 and 50 nm, the lengthening of the gates with respect to Lmin only extending towards the non common source and drain regions of the cell.

Since portions 57b and 59b are sufficiently remote from contact areas 32 and 34, the gate length increase does not risk causing short-circuits between the gate and the contact areas. No lengthening of the gates can be performed towards the common source-drain region since minimum distance dGGmin (for example, 140 nm in 40-nm CMOS technology) between the two gates would then no longer be respected.

Thus, in cell 51, the MOS transistors have an equivalent gate length greater than that of the transistors of cell 31, and cell 51 takes up a silicon surface area identical to that taken up by cell 31.

More generally, an aspect of the present invention is to provide a cell library comprising, for each cell type, a definition at the minimum dimensions of the technology, and a definition at decreased leakage current in which some MOS transistors comprise longer gate portions, the cells formed according to one and the other of the two definitions taking up an identical silicon surface area.

Figure 3:
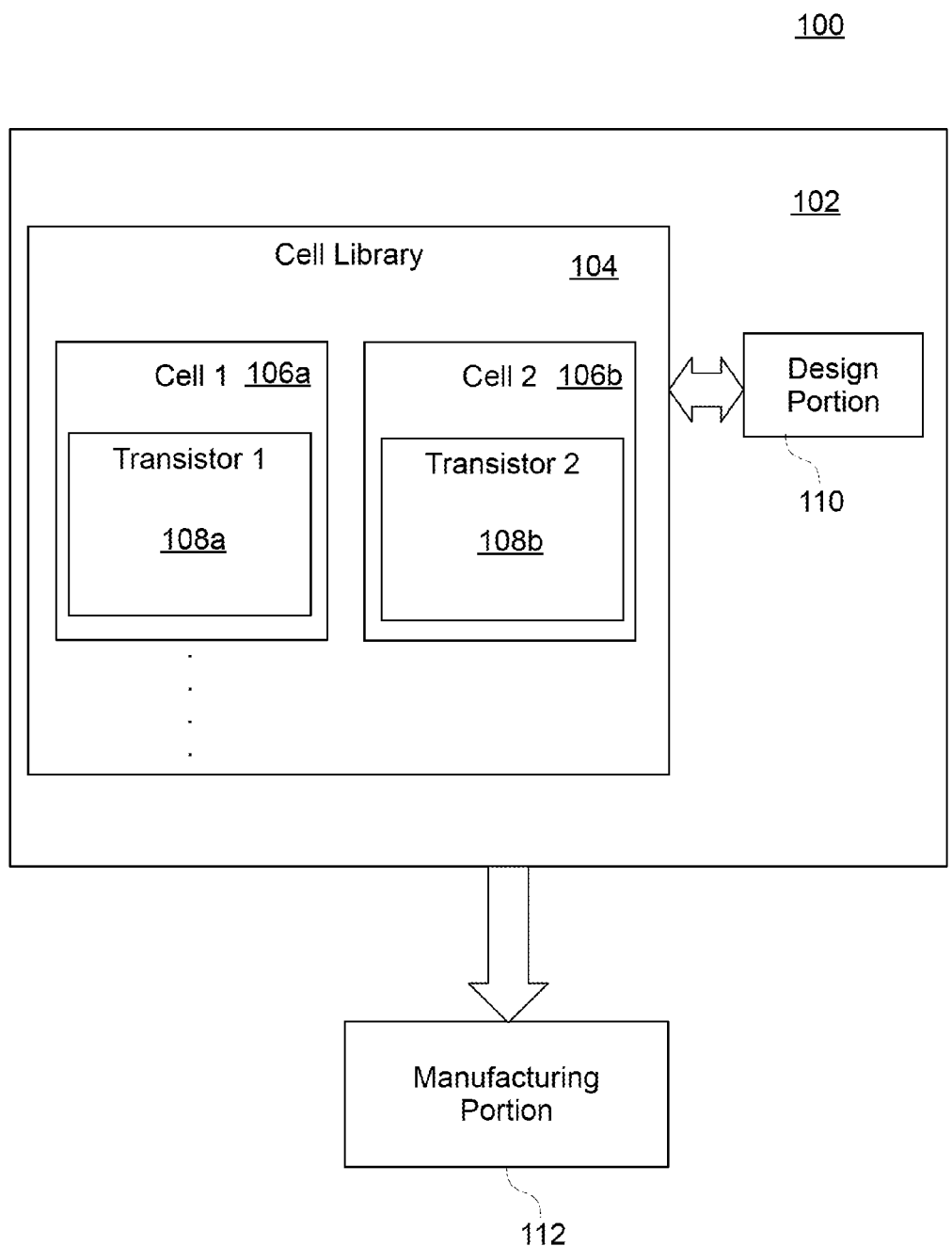
FIG. 3 is a logical diagram showing a circuit synthesis system having a cell library according to an embodiment.

As shown in FIG. 3, a cell library 104 may be disposed in a system 102 for synthesizing an integrated circuit, such as a computer-aided circuit design, synthesizing or fabrication system. The cell library 104 may be stored on a nontangible, computer readable medium accessible through a design portion 110 of the system configured to permit selection of a cell 106a and 106b according to requirements of a portion of the integrated circuit. The cell library 104 may comprise a definition of a first cell 106a including a first MOS transistor 108a of a minimum dimension and a definition of a second cell 106b including a second MOS transistor 108b of lower leakage current. In such a cell library 104, the second cell 106b takes up the same surface area as the first cell 106a, and the second MOS transistor 108b has a gate of same length as the gate of the first MOS transistor 108a across at least a first width in its central portion, and of greater length across at least a second width on either side of the central portion. The system 102 may further be connected to a manufacturing portion 112 configured to manufacture an integrated circuit comprising first and second cells of the library.

Figure 4:
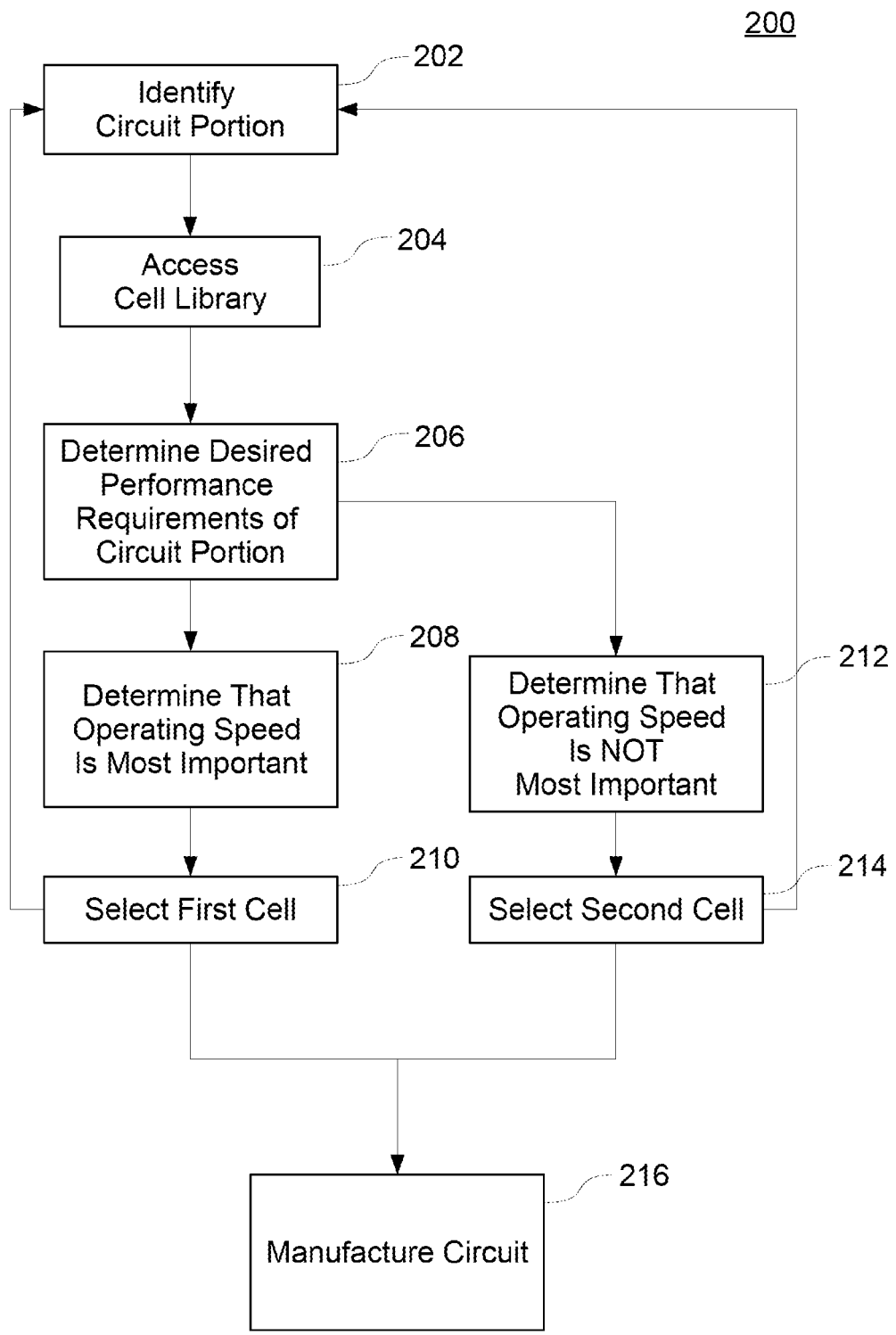
FIG. 4 is a flow diagram illustrating a method of synthesizing and manufacturing a circuit according to an embodiment.

An advantage of such a library is that it enables one to synthesize integrated circuits in which the transistors which are not critical in terms of speed may have decreased leakage currents. A method 200 of manufacturing an integrated circuit according to an embodiment is illustrated in FIG. 4. A first circuit portion may be identified in block 202 as having a first design or performance requirement of a first function and wherein operating speed is a more important parameter than leakage current. A second circuit portion may be identified in block 202 as having a second design of performance requirement of the first function and wherein operating speed is not a more important parameter than leakage current. The desired performance requirements of the Circuit Portion may be determined in block 206. The designer may select one or the other of the two cell definitions according to the requirements of the concerned circuit portion. The designer may choose between two cells according to a desire to optimize the transistor operating speed or the electric consumption of the circuit portion. If, in block 208, the designer determines that operating speed of a transistor in the circuit portion is most important, the designer may, in block 210, select the first cell from the cell library. If, in block 212, the designer determines that operating speed of a transistor in the circuit portion is not most important, the designer may, in block 214, select the second cell from the cell library. Since the two cells take up identical surface areas, this choice left to the designer does not add complexity to the cell location and interconnection process. After selection of the first or second cell in clock 210 and 214, additional circuit portions may be identified in block 202, or the circuit may be manufactured in block 216.

An integrated circuit having portions synthesized from the cell library and comprising at least one first cell and at least one second cell may be manufactured from the integrated circuit synthesis. The integrated circuit may be manufactured on semiconductor fabrication equipment configured to, for example, produce MOS devices using a 40 nm process. The integrated circuit may be manufactured having a first cell meeting the first design requirement, the first cell occupying a first amount of surface area and comprising a first transistor having a first gate length. The integrated circuit may also be manufactured having a second cell meeting the second design requirement, the second cell occupying the same amount of surface area as the first cell and comprising a second transistor having a gate of same length as the gate of the first transistor across at least a first portion of the gate of the second transistor, and of greater length across at least a second portion the second gate.

Specific embodiments of the present invention have been described. Various alterations and modifications will occur to those skilled in the art. In particular, two types of cells comprising MOS transistors have been described hereabove. The present invention is not limited to these specific examples, and may be implemented for other types of cells comprising MOS transistors.

Further, examples of cell dimensions have been provided hereabove as an illustration in the context of a 40-nm CMOS technology. The present invention is not limited to this specific case. It will be within the abilities of those skilled in the art to implement the desired operation by using other technologies and other dimensions.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A system for synthesizing an integrated circuit, comprising:
   a cell library stored on a nontangible, computer readable medium, and intended to be used to form an integrated circuit, said library comprising:
   a definition of a first cell including a first MOS transistor of a minimum dimension; and
   a definition of a second cell including a second MOS transistor of lower leakage current;
   wherein the second cell takes up the same surface area as the first cell, and the second MOS transistor has a gate of same length as the gate of the first MOS transistor across at least a first width in its central portion, and of greater length across at least a second width on either side of the central portion; and
   a design portion configured to permit selection of a cell according to requirements of a portion of the integrated circuit.

2. The system of claim 1, wherein each of the first and second cells comprises two transistors having a shared same source-drain with parallel gates, wherein the gates of the transistors of the second cell are of same length as the gates of the transistors of the first cell across said at least a first width, and extending, across said at least a second width, along a greater length towards the side opposite to the common side.

3. The system of claim 1, wherein the first and second cells each comprise, on either side of the respective gate(s), respective source/drain contact areas arranged at the center of respective sources and drains.

4. The system of claim 1 wherein the system is connected to a manufacturing portion configured to manufacture an integrated circuit comprising first and second cells of the library.

5. The system of claim 1, wherein said minimum dimension is 40 nm.

6. The cell library of claim 1, wherein said minimum dimension is 40 nm.

7. The cell library of claim 1, wherein the first cell and the second cell are instantiated in an integrated circuit.

8. A method for synthesizing at least a portion of an integrated circuit, comprising, for each MOS transistor of the integrated circuit, the steps of:
  accessing a cell library stored on a non-transient computer readable medium, the cell library having a first cell defined therein, the first cell having a first MOS transistor, the cell library further having a second cell defined therein, the second cell having a second MOS transistor, wherein the second cell takes up the same surface area as the first cell, and wherein the second MOS transistor has a gate of same length as the gate of the first MOS transistor across at least a first width in a central portion, and wherein the second MOS transistor has a gate of greater length across at least a second width on either side of the central portion;
  selecting a first cell if a first MOS transistor is intended to operate at maximum speed;
  selecting a second cell if a second MOS transistor is not intended to operate at maximum speed; and
  manufacturing an integrated circuit having portions synthesized from the cell library and comprising at least one first cell and at least one second cell.

9. An integrated circuit comprising:
  a plurality of cells;
  wherein a first one of said plurality of cells includes a first MOS transistor having a feature of a minimum dimension, and a second one of said plurality of cells includes a second MOS transistor having lower leakage current than said first MOS transistor, and
  wherein the second cell takes up the same surface area as the first cell, and the second MOS transistor has a gate of same length as the gate of the first MOS transistor across at least a first width in its central portion, and of greater length across at least a second width on at least one side of the central portion.

10. The integrated circuit of claim 9, wherein said feature of a minimum dimension is gate length.

11. The integrated circuit of claim 10, wherein the minimum dimension is 40 nm.

12. The integrated circuit of claim 9, wherein the first cell and the second cell are each a respective cell selected from the group consisting of a MOS transistor, two MOS transistors sharing a source/drain, a logic gate, an inverter, and an amplifier.

13. The integrated circuit of claim 9, wherein an outer boundary of said first is defined by an isolation region.

14. The integrated circuit of claim 13, wherein said isolation region is a shallow trench isolation.

15. The integrated circuit of claim 9, wherein said feature of a minimum dimension is a distance between a gate of the MOS transistor and a drain contact or a source contact of the first MOS transistor.

16. The integrated circuit of claim 9, further comprising:
  wherein said first one of said plurality of cells includes a third MOS transistor sharing a source/drain region with said first MOS transistor and said second one of said plurality of cells includes a fourth MOS transistor sharing a source/drain region with said second MOS transistor; and
  wherein a gate of said first MOS transistor and a gate of said third MOS transistor are spaced apart by a pre-defined minimum distance and a gate of said second MOS transistor and said fourth MOS transistor are spaced apart by said pre-defined minimum distance.

17. A method of manufacturing an integrated circuit comprising:
  identifying a first circuit portion having a first design requirement of a first function and wherein operating speed is a more important parameter than leakage current;
  identifying a second circuit portion having a second design requirement of the first function and wherein operating speed is not a more important parameter than leakage current;
  manufacturing a first cell meeting the first design requirement, the first cell occupying a first amount of surface area and comprising a first transistor having a first gate length; and
  manufacturing a second cell meeting the second design requirement, the second cell occupying the same amount of surface area as the first cell and comprising a second transistor having a gate of same length as the gate of the first transistor across at least a first portion of the gate of the second transistor, and of greater length across at least a second portion the second gate.

18. The method of claim 17, further comprising determining a location for the first cell and the second cell in the integrated circuit.

19. The method of claim 17, further comprising interconnecting the first cell and the second cell in the integrated circuit.

20. The method of claim 17, wherein the first cell is selected from the group consisting of a transistor, a pair of transistors, a logic gate, an inverter, and an amplifier.

* * * * *

UNITED STATES PATENT AND TRADEMARK OFFICE
CERTIFICATE OF CORRECTION

PATENT NO. : 8,458,638 B2  Page 1 of 1
APPLICATION NO. : 13/023172
DATED : June 4, 2013
INVENTOR(S) : Menut et al.

It is certified that error appears in the above-identified patent and that said Letters Patent is hereby corrected as shown below:

Title Page: insert

Item --(30)    Foreign Application Priority Data

Feb. 9, 2010  (FR) ......................................... 10 50891--

Signed and Sealed this
Thirtieth Day of July, 2013

Teresa Stanek Rea
*Acting Director of the United States Patent and Trademark Office*